United States Patent
Gonzalez et al.

(10) Patent No.: US 10,301,740 B2
(45) Date of Patent: May 28, 2019

(54) SYSTEMS, METHODS AND APPARATUS FOR ELECTROPLATING PHOTOVOLTAIC CELLS

(71) Applicant: SolarCity Corporation, San Mateo, CA (US)

(72) Inventors: Pablo Gonzalez, Fremont, CA (US); Ming-Du Kang, San Rafael, CA (US)

(73) Assignee: SolarCity Corporation, San Mateo, CA (US)

( * ) Notice: Subject to any disclaimer, the term of this patent is extended or adjusted under 35 U.S.C. 154(b) by 141 days.

(21) Appl. No.: 14/983,301

(22) Filed: Dec. 29, 2015

(65) Prior Publication Data

US 2017/0167044 A1 Jun. 15, 2017

Related U.S. Application Data (60) Provisional application No. 62/267,202, filed on Dec. 14, 2015.

(51) Int. Cl.
*C25D 17/06* (2006.01)
*C25D 7/12* (2006.01)
(Continued)

(52) U.S. Cl.
CPC ............ *C25D 17/06* (2013.01); *C25D 7/126* (2013.01); *C25D 17/001* (2013.01); *C25D 17/08* (2013.01); *H01L 21/2885* (2013.01); *H01L 31/022458* (2013.01); *H01L 31/18* (2013.01); *C25D 5/02* (2013.01)

(58) Field of Classification Search
CPC .......... C25D 17/06; C25D 17/08; H01L 31/18
See application file for complete search history.

(56) References Cited

U.S. PATENT DOCUMENTS 4,937,108 A * 6/1990 Crisp ................ H01L 21/67144
428/13
4,988,426 A 1/1991 Metzka et al.
(Continued)

FOREIGN PATENT DOCUMENTS

CN 201420102 3/2010
CN 101713094 5/2010
(Continued)

OTHER PUBLICATIONS

Machine Translation of CN203878232U and published Figures.*
(Continued)

*Primary Examiner* — Bryan D. Ripa
(74) *Attorney, Agent, or Firm* — Kilpatrick Townsend & Stockton LLP (57) ABSTRACT

A two piece electroplating frame or electroplating frame is disclosed that is suitable for holding multiple solar cells during an electroplating operation. The electroplating frame can be formed from or at least covered with non-conductive material to reduce the collection of plating material on the electroplating frame. The two pieces of the electroplating frame can be coupled together around the solar cells by magnets distributed throughout the electroplating frame. The electroplating frame can include alignment features for self-aligning the assembly of the two pieces without requiring precise pre-alignment.

14 Claims, 10 Drawing Sheets

A-A (51) Int. Cl.
*H01L 31/0224* (2006.01)
*H01L 31/18* (2006.01)
*C25D 17/00* (2006.01)
*C25D 17/08* (2006.01)
*H01L 21/288* (2006.01)
*C25D 5/02* (2006.01)

(56) References Cited

U.S. PATENT DOCUMENTS

| | | | |
|---|---|---|---|
| 2005/0061665 | A1 | 3/2005 | Pavani et al. |
| 2008/0277286 | A1* | 11/2008 | Richardson ............ C25D 17/08 205/147 |
| 2012/0073974 | A1 | 3/2012 | Abas et al. |
| 2012/0073975 | A1* | 3/2012 | Ganti ..................... C25D 17/08 205/80 |
| 2014/0367268 | A1* | 12/2014 | Naito ................... H01G 9/0029 205/171 |
| 2015/0176148 | A1* | 6/2015 | Kim ..................... C25D 17/001 204/297.1 |

FOREIGN PATENT DOCUMENTS

| | | | |
|---|---|---|---|
| CN | 201901717 | | 7/2011 |
| CN | 104032360 | | 9/2014 |
| CN | 203878232 | | 10/2014 |
| CN | 203878232 U | * | 10/2014 |
| CN | 204298484 | | 4/2015 |
| JP | 2000199099 | | 7/2000 |

OTHER PUBLICATIONS

PCT/US2016/050267, "International Search Report and Written Opinion", dated Nov. 2, 2016, 14 pages.

Chinese Utility Model No. CN201621148184.7, "Evaluation Report for Utility Model Patent", Nov. 3, 2017, 11 pages.

* cited by examiner

SYSTEMS, METHODS AND APPARATUS FOR ELECTROPLATING PHOTOVOLTAIC CELLS

CROSS-REFERENCES TO RELATED APPLICATIONS

This application claims the benefit of Provisional Application No. 62/267,202, filed on Dec. 14, 2015, the entirety of which is incorporated by reference.

FIELD OF THE INVENTION

This disclosure is generally related to processing solar cells. More specifically this disclosure describes an electroplating frame for holding solar cells during an electroplating process.

Definitions

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of a strip may be the same or different from each other. Strips may be formed by further dividing a previously divided strip.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Recent advancements in solar cell technology have helped overcome many barriers to producing highly efficient and economically viable photovoltaic (PV) modules. Traditionally, crystalline silicon (c-Si) based solar cells have relied on the use of silver (Ag) grids (e.g. fingers and busbars) for collecting current. Ag grids are formed by printing Ag paste onto wafers and firing the past at temperatures between 700-800° C.

Newer solar cells use amorphous Si (a-Si) to form a heterojunction with a c-Si layer or provide for surface passivation. However, a-Si cannot be processed at temperatures exceeding 200° C., and therefore not compatible with traditional Ag paste. One approach to this issue was the use of low temperature Ag paste to form the conductive grid. However, low temperature Ag paste is highly resistive compared to traditional paste and therefore required a comparatively thick layer. This required using a layering technique in which several layers of low temperature paste were successively applied. The cost and complexity of that process was ultimately prohibitive.

A different approach to this issue was to not use Ag paste at all, but instead apply a layer of copper, which can be etched by photolithography to form the grid. But using copper presented its own issues, as copper does not adhere well to silicon using electroplating techniques. Innovators of the industry, such as Silevo Inc., pioneered processes in which a thin seed layer of copper is first applied to the a-Si by physical vapor deposition. This seed layer has excellent adhesion properties, and forms the basis for a thick layer of copper deposited by electroplating. Details of such a process is disclosed at Pub. No. US20130125974A1, which is incorporated by reference herein.

Clearly, solar technology has made great strides in recent years through breakthroughs for increasing efficiency of PV modules. Such improvements are making solar energy a more viable energy source. In spite of these technological breakthroughs in efficiency, cost per watt is perhaps the most determinative factor when deciding to implement solar power. Thus, any aspect of the PV module manufacturing process that can increase throughput, and hence lower cost, has great importance for the viability of solar energy.

Electroplating copper is normally a simple procedure, but in spite of the seed layer, electroplating of silicon solar cells can still be a manually intensive process. This is because each solar cell requires manual placement of several small plating electrodes onto sections of the solar cell to form the electroplated layer. Each electrode must be individually placed and aligned. Because several electrodes required per solar cell, this can make for a very time consuming process, which can be troubled by breakages due to the intensive handling required. Accordingly, improving this process and reducing handling is important for improving throughput of PV module production.

SUMMARY

This disclosure describes various embodiments that relate to an electroplating frame for handling one or more solar cells during an electroplating process.

An electroplating frame for supporting solar cells during a manufacturing operation is disclosed. The electroplating frame can be constructed from a number of different parts. The frames can be formed of a robust material that is unlikely to degrade under the conditions experienced during an electroplating operation. When the material is made of metals that could erode from direct contact with electroplating solution, that material can be protected by a layer that prevents or ameliorates such erosion.

The first frame defines pockets that each have a shape and size suitable for supporting one of the solar cells. Each pocket can include one or more support structures that support a periphery of a solar cell positioned within the pocket. In some embodiments, the support structure can take the form of a lip extending around the pocket. In some embodiments, the support structures can take the form of multiple protrusions extending into the pocket. When the solar cell resides within the pocket, lateral facing walls that form the pocket can prevent substantial lateral movement of the solar cell within the pocket.

The second frame can includes a number of pins configured to engage peripheral portions of each of the solar cells supported by the first frame. The pins are arranged so that a number of pins are distributed around each of the pockets defined by the first frame when the first and second frames are secured together. Magnets can be distributed within the first and second frames to allow the first and second frames to be quickly and securely coupled together. The magnets in the first and second frames can be configured to cooperate to secure the first and second frames together. The first and second frames can include alignment features such as tapered pins, which ensure a precise alignment between the first and second frames, without the need to closely pre-align the first and second frames with one another.

The electroplating frame can also include hard stops configured to establish a minimum interval between the first and second frames when the frames are secured together. The hard stops can have opposing parallel surfaces so that the minimum interval is set by a thickness of the hard stops. The hard stops can also be used to prevent magnets within the first frame from directly contacting magnets within the second frame. By establishing a gap between the magnets, friction between the magnets can be prevented.

A method for electroplating solar cells with the aforementioned electroplating frame is disclosed. The method includes placing each of the solar cells into a corresponding pocket defined by a first frame of the electroplating frame. Placement of the solar cells within the pockets can be done in any number of ways including but not limited to sequential placement of the solar cells by a pick and place device. After the desired solar cells are placed within the first frame, the first frame can be magnetically coupled to a second frame to secure the solar cells within the electroplating frame. Magnetic fasteners disposed within the first and second frames can cause the first and second frames to combine so that alignment features coupled to the second frame engage specific peripheral portions of each of the solar cells. Because of the precise placement of the alignment features by the first and second frames, the likelihood of pressure being placed in incorrect locations can be substantially reduced.

Subsequent to securing the solar cells by magnetically coupling the first and second frames together, the electroplating frame enclosing the solar cells can be lowered into a volume of liquid. In some embodiments, the solar cells can be coupled with the negative terminal of a power source through the first and second frames. This can be especially effective when the first and second frames are formed from electrically conductive cores. In this way, a portion of the upper and lower frame outside of the volume of liquid can be coupled with the power source. In embodiments where the second frame is non-conductive, leads can be attached to each solar cell by way of one or more of the securing feature that secure the solar cells within the electroplating frame. In this way, portions of the solar cell configured to receive plating are charged and receive plating material. In some embodiments, conductive cores of the first and second frames can be electrically coupled together by an electrically conductive pin.

In many embodiments, the method also includes: removing the electroplating frame from the volume of liquid. This can be done by automated machinery, which can then subsequently decouple the first frame from the second frame by applying a force to portions of the second frame that correspond to the magnetic fasteners disposed within the second frame. Finally, the solar cells can be removed from the first frame by one or more automated manufacturing devices, such as a pick and place. The electroplated solar cells can then undergo further processing steps or be packaged for distribution to users of the solar cells.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Methods and apparatus for electroplating photovoltaic cells are disclosed according to the embodiments of the invention. The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

References are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The delicate nature of solar cells often requires complex and costly electroplating frames to prevent damage to the solar cells during the manufacturing process. One electroplating frame design capable of minimizing stress placed upon fragile solar cells that can be easily operated, involves utilizing a electroplating frame having an upper and lower frame configuration where the frames are magnetically coupled together around the solar cells when in use. By distributing multiple magnets throughout the upper and lower frames, the magnets can be configured so that misalignment of the upper frame and lower frame is difficult if not impossible. The electroplating frame can also include various alignment features, such as tapered alignment pins configured to cause precise final alignment of the upper and lower frames, while only requiring bringing the upper and lower frames into a relatively non-precise initial alignment.

In some embodiments, the magnets can be arranged within the upper and lower frames so that direct contact between the magnets is prevented. In this way, friction between the coupled magnets does not prevent or imped more precise alignment of the frames by other alignment features of the upper and lower frame members. In some embodiments, pins integrated into the upper frame can be configured to engage regions of the solar cells for electroplating the solar cells. The lower frame can include a corresponding support protrusion that supports a lower surface below a region of the solar cell receiving force from each pin. The lower frame can also define multiple pockets with sidewalls configured to keep a corresponding solar cell positioned within the pocket constrained in a plane parallel to the lower frame.

These and other embodiments are discussed below with reference to FIGS. 2A-7F; however, those skilled in the art will readily appreciate that the detailed description given herein with respect to these figures is for explanatory purposes only and should not be construed as limiting.

Figure 1A:
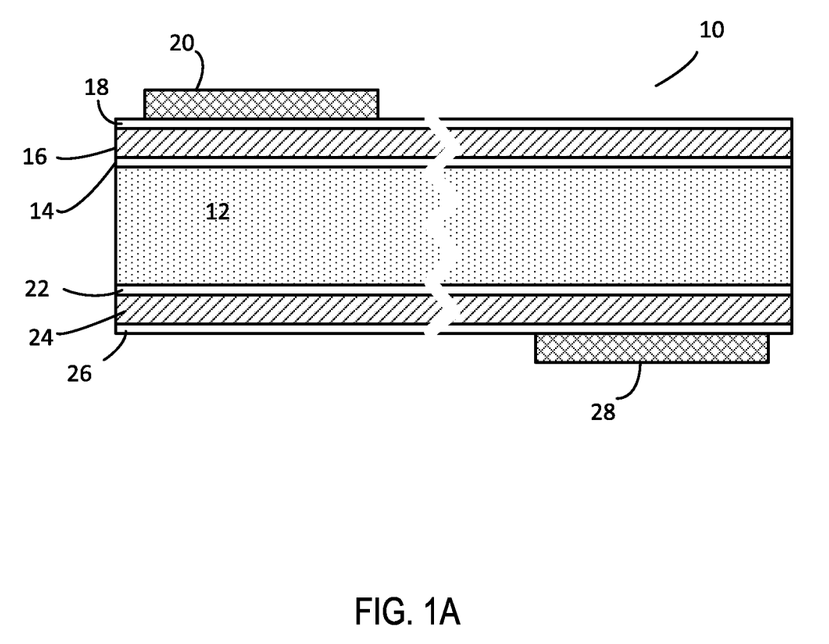
FIGS. 1A and 1B respectively show cross-sectional and top views of solar cells.

FIG. 1A shows one example of a photovoltaic structure, which has been processed to include a conductive grid pattern of finger lines and busbars. Solar cell 10 in this example can include N type lightly doped crystalline silicon (c-Si) base layer 12, intrinsic tunneling layer 14, N type heavily doped amorphous silicon (a-Si) surface field layer 16, transparent conductive oxide (TCO) layer 18, and frontside busbar 20. On the backside, the structure can include intrinsic tunneling layer 22, P type a-Si emitter layer 24, TCO layer 26, and backside busbar 28. The backside tunneling junction, formed by P type a-Si emitter layer 24, intrinsic tunneling layer 22, and N type c-Si base layer 12, can transport away the majority carriers generated by base layer 12. The front side tunneling junction, formed by N type heavily doped a-Si surface field layer 16, intrinsic tunneling layer 14, and base layer 12, can transport away the minority carriers generated by base layer 12, thereby reducing the amount of carrier recombination in base layer 12. Tunneling layers 14 and 22 can passivate the interface between base layer 12 and the two heavily doped a-Si layers while still allowing carriers generated by base layer 12 to enter these a-Si layers due to tunneling effect.

Figure 1B:
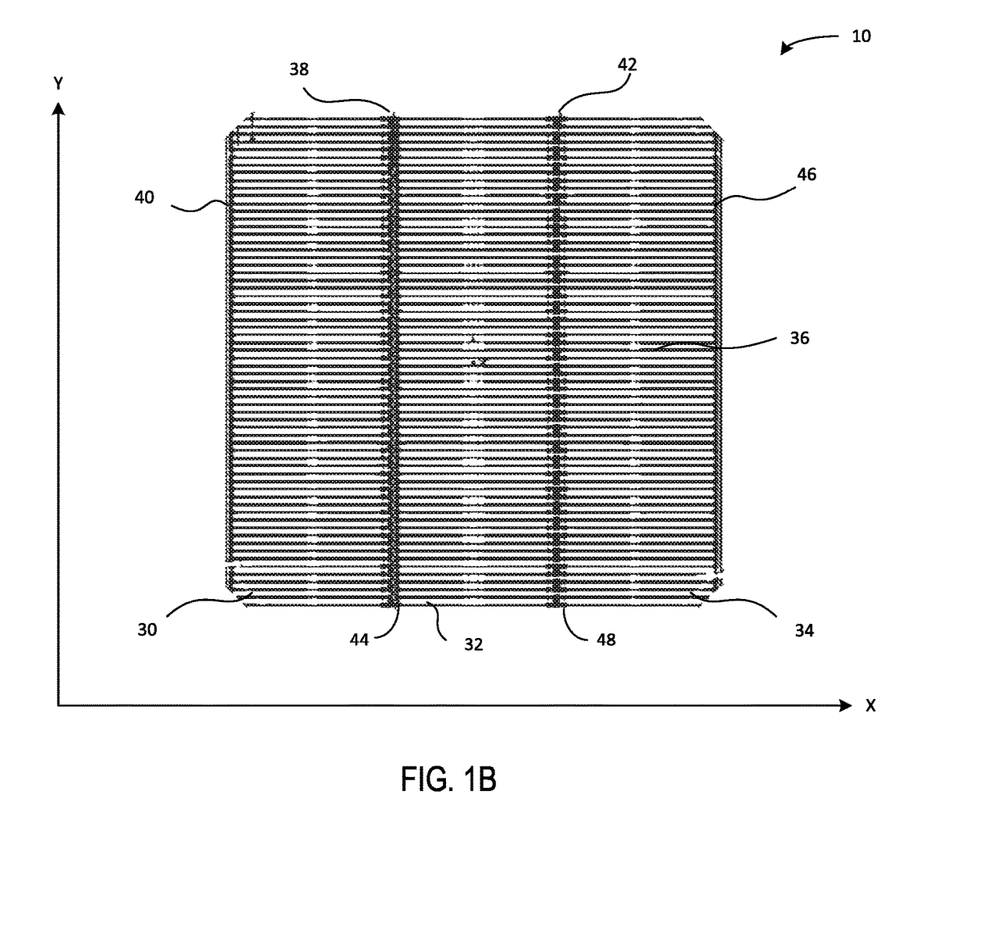

FIG. 1B shows solar cell 10 including three photovoltaic strips 30, 32, and 34. Solar cell 10 can have an electroplated copper electrode that exhibits low contact resistance. Each strip can include a number of substantially parallel finger lines, such as finger lines 36, arranged in the X direction. These finger lines can collect the carriers generated by the photovoltaic structure and allow them to move toward a busbar. The busbar can be any electrically conductive element such as a metallic strip, often wider than a finger line, arranged in the Y direction. The busbar then can aggregate the current collected by the finger lines. Each strip can include two busbars, one on each surface, positioned on opposite edges. For example, strip 30 can have busbar 38 on the top surface, and busbar 40 on the bottom surface. Similarly, strip 32 can have busbars 42 and 44 on the top and bottom surfaces, respectively, and strip 34 can have busbars 46 and 48 on the top and bottom surfaces, respectively.

Prior to formation of the busbars and fingers lines depicted at FIGS. 1A and 1B, a vapor deposition process can be applied to solar cell 10 to form a seed layer of copper over TCO layers 18 and 26. The seed layer is masked prior to electroplating to thicken the copper so that only the non-masked areas are electroplated. After electroplating, the remaining seed layer under the mask can be subsequently removed to form finger lines and busbars, which are areas that have been electroplated. An electroplating frame and method for using the electroplating frame to form the electroplated layer is discussed below.

Figure 2A:
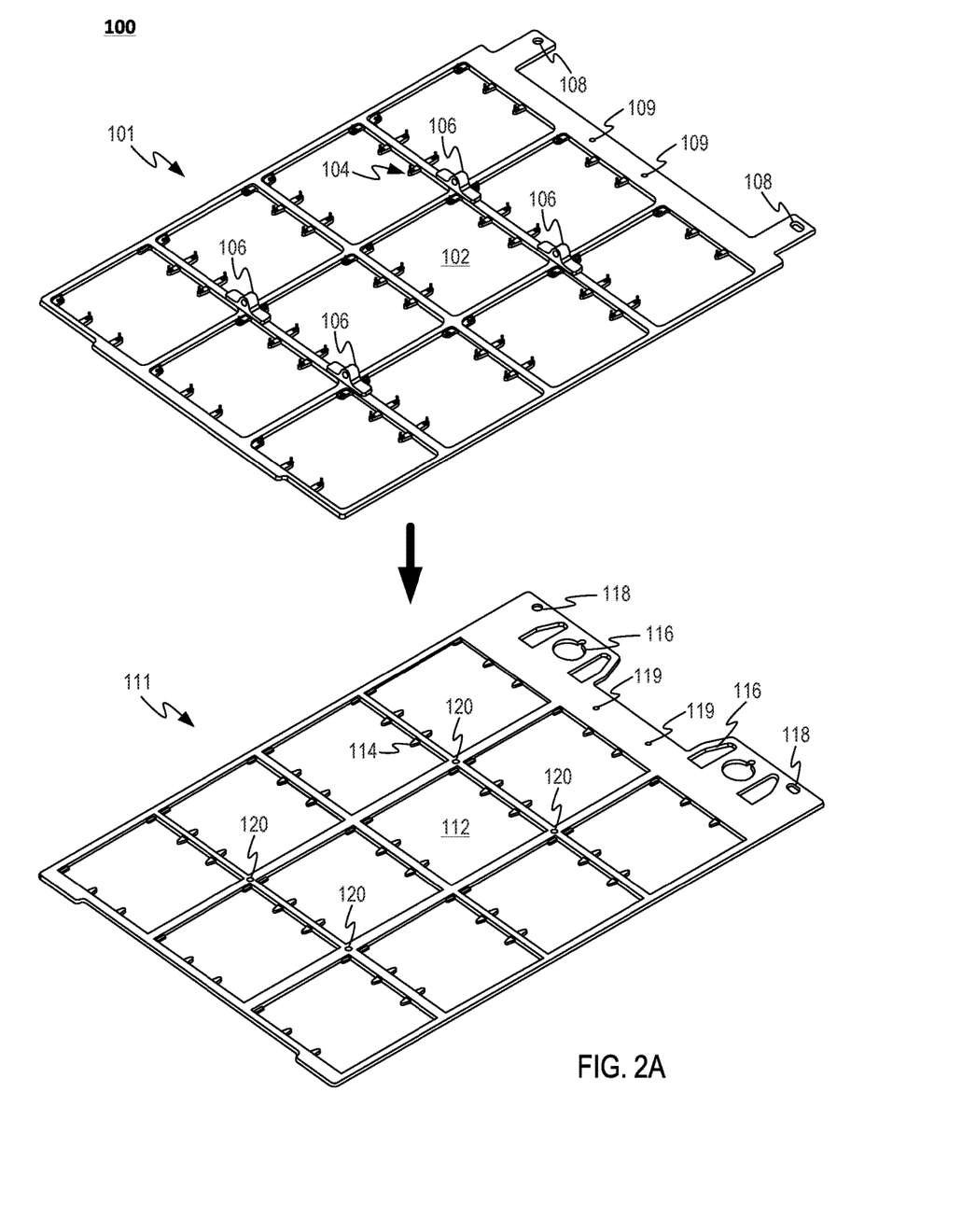
FIG. 2A shows a perspective view of an upper frame and a lower frame of an electroplating frame suitable for use with the described embodiments.

FIG. 2A shows a perspective view of upper frame 101 of electroplating frame 100 suitable for use with the described embodiments. Upper frame 101 includes multiple apertures 102, each of apertures 102 having a shape and size similar to the solar cells it is configured to carry, such as the solar cell depicted at FIG. 1B for example. Apertures 102 leave an upward facing surface of the solar cells exposed so as not to interfere with electroplating operations. Apertures 102 are defined by a grid structure from which electrical pins 104 extend into.

Electrical pins 104 extend into aperture 102 and are configured to engage an upward facing surface of a solar cell carried by electroplating frame 100 to electroplate one or more portions of the solar cell. Electroplating frame 100 includes multiple alignment features that help electrical pins 104 exert a predetermined amount of force on particular portions of each of the solar cells carried by electroplating frame 100.

Carrying handles 106 can take the form of gripping features for one or more robotic arms to manipulate upper frame 101. Carrying handles 106 can be positioned directly above magnetic fasteners embedded within upper frame 101. This co-positioning of carrying handles 106 and the magnetic fasteners prevents an upward force exerted upon each of handles 106 from exerting a bending moment upon upper frame 101. In embodiments where upper frame 101 is particularly thin or vulnerable to bending, this arrangement of placing carrying handle 106 near each of the magnetic fasteners can increase the effective life or number of cycles through which upper frame 101 can be utilized.

Upper frame 101 also defines multiple openings 108 for securing upper frame 101 to a lower frame. Upper frame 101 also defines tapered openings 109. Tapered openings 109 can have a tapered geometry configured to interact with an alignment feature to assist in aligning upper frame 101 with a lower frame with which the alignment feature is coupled.

FIG. 2A also shows a perspective view of lower frame 111 of electroplating frame 100 suitable for use with the described embodiments. Lower frame 111 cooperates with upper frame 101 to form electroplating frame 100. Lower frame 111 also takes the form of a substantially planar grid structure that defines a number of pockets 112 having a shape and size in accordance with a solar cell. Pockets 112 are sized so that once positioned within pockets 112 the photovoltaic cells have little or no room to be displaced laterally. Lower frame 111 can also include a number of lower support structures 114 that extend into each pocket 112. Lower support structures 114 provide support that keeps solar cells within pockets 112. In addition to keeping the solar cells within pockets 112, lower support structures 114 are also positioned to support peripheral portions of the solar cell that receives force from electrical pins 104.

Lower frame 111 can also include multiple openings 116 from which lower frame 111 can be attached to a robotic arm or hook. The large circular geometry of one of openings 116 allows a large hook to pass through opening 116 while the lobe extending from the large circular portion can engage an alignment feature on the robot or hook to facilitate proper positioning of electroplating frame 100 during an electroplating operation. In this way, upper and lower frames 101 and 111 can be suspended vertically during a plating operation. The more vertically oriented openings 116 can also be designed to receive an articulated arm or hooking mechanism similar to the other more circular openings 116. Alternatively, vertical openings 116 can be configured for a different purpose such as hanging lower frame 111 up for storage or cleaning.

Lower frame 111 also defines two openings 118 that in cooperation with openings 108 can be used to secure upper and lower frames 101 and 111 together with a fastener. In addition to the aforementioned openings, lower frame 111 also defines alignment openings 119, which are positioned so that alignment features positioned within alignment openings 119 can interact with tapered openings 109 to assist in aligning upper frame 101 with lower frame 111.

FIG. 2A also shows magnetic fasteners 120 disposed within lower frame 111. As should be appreciated, locations of magnetic fasteners 120 correspond to locations at which carrying handles 106 are located with respect to upper frame 101. Magnetic fasteners 120 can take many forms but in general each should include a permanent magnet surrounded by a protective shell that includes features for attaching and aligning it with lower frame 111. In some embodiments, the polarity of permanent magnets of each magnetic fastener 120 can be alternated so that magnetic fasteners 120 only allow upper and lower frames 101 and 111 to be magnetically coupled in the correct orientation. In some embodiments, the permanent magnets can take the form of rare earth magnets along the lines of neodymium magnets.

While not depicted in FIG. 2A (due to being obscured by carrying handles 106), upper frame 101 also includes a number of magnetic fasteners 120 positioned beneath carrying handles 106. It should be noted that while upper and lower frames 101 and 111 are depicted in a way that suggests the use of rectangular or square solar cells, that other configuration suitable for carrying different geometry solar cells are also possible. For example, hexagonal geometries could be implemented in similar ways to the configurations depicted in FIG. 2A. Pockets 112 could be modified to have a hexagonal shape instead of a rectangular shape.

Figure 2B:
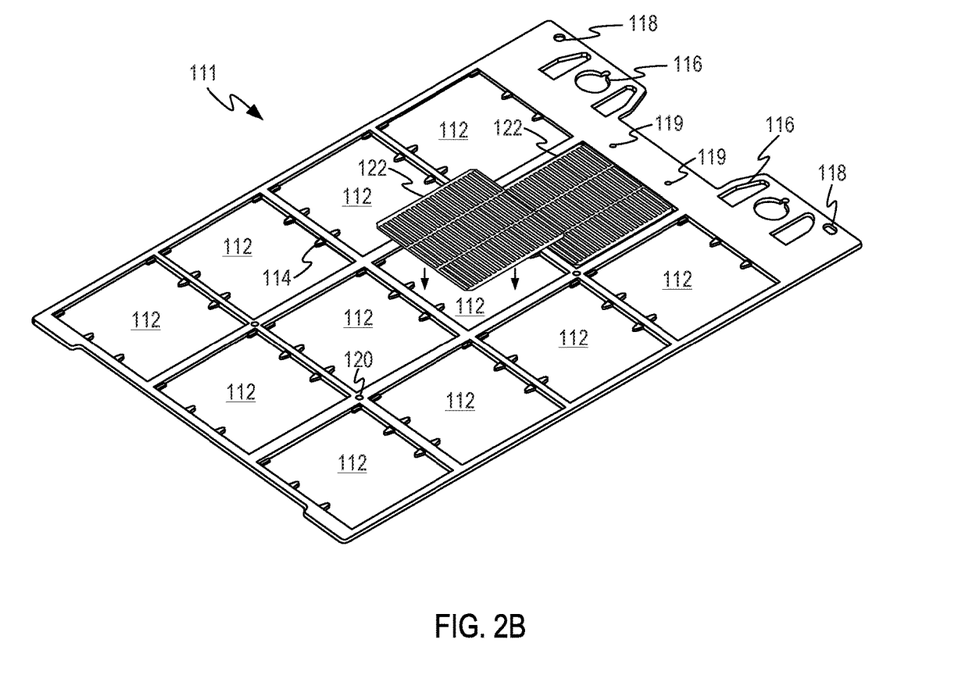
FIG. 2B shows a solar cell positioned within a pocket of the lower frame depicted in FIG. 2A and another solar cell being lowered into another one of the pockets of the lower frame.

FIG. 2B shows a solar cell positioned within one of pockets 112 of lower frame 111 and another solar cell being lowered into another one of pockets 112. Solar cells 122 can be positioned within lower frame 111 by, for example, a pick and place or robotic arm. In some embodiments, a suction head can be utilized to lower and position solar cells into pockets defined by lower frame 111.

FIG. 2B also shows how solar cells 122 sit within pockets 112 of lower frame 111. This is enabled in part by lower support structures 114 not extending up to a top surface of lower frame 111. Instead, because lower support structures 114 are recessed below the top surface, solar cells positioned within pockets 112 are laterally constrained by walls defining pockets 112. It should be noted that while lower support structures 114 are depicted in a particular manner, solar cells 122 can be supported within pockets 112 in other ways as well. For example, a recessed ledge arranged along a periphery of pockets 112 can also be utilized to support solar cells 122 within pockets 112. It should also be noted that while only two solar cells are being shown positioned within pockets 112, that the depicted lower frame 111 is configured to accommodate up to twelve solar cells, and further that this type of lower frame 111 could be scaled up to carry many more solar cells if larger scale electroplating operations are desired. Alternatively, lower frame 111 could be scaled down to hold a much smaller number of solar cells. For example, lower frame 111 could only define four pockets 112.

Figure 3:
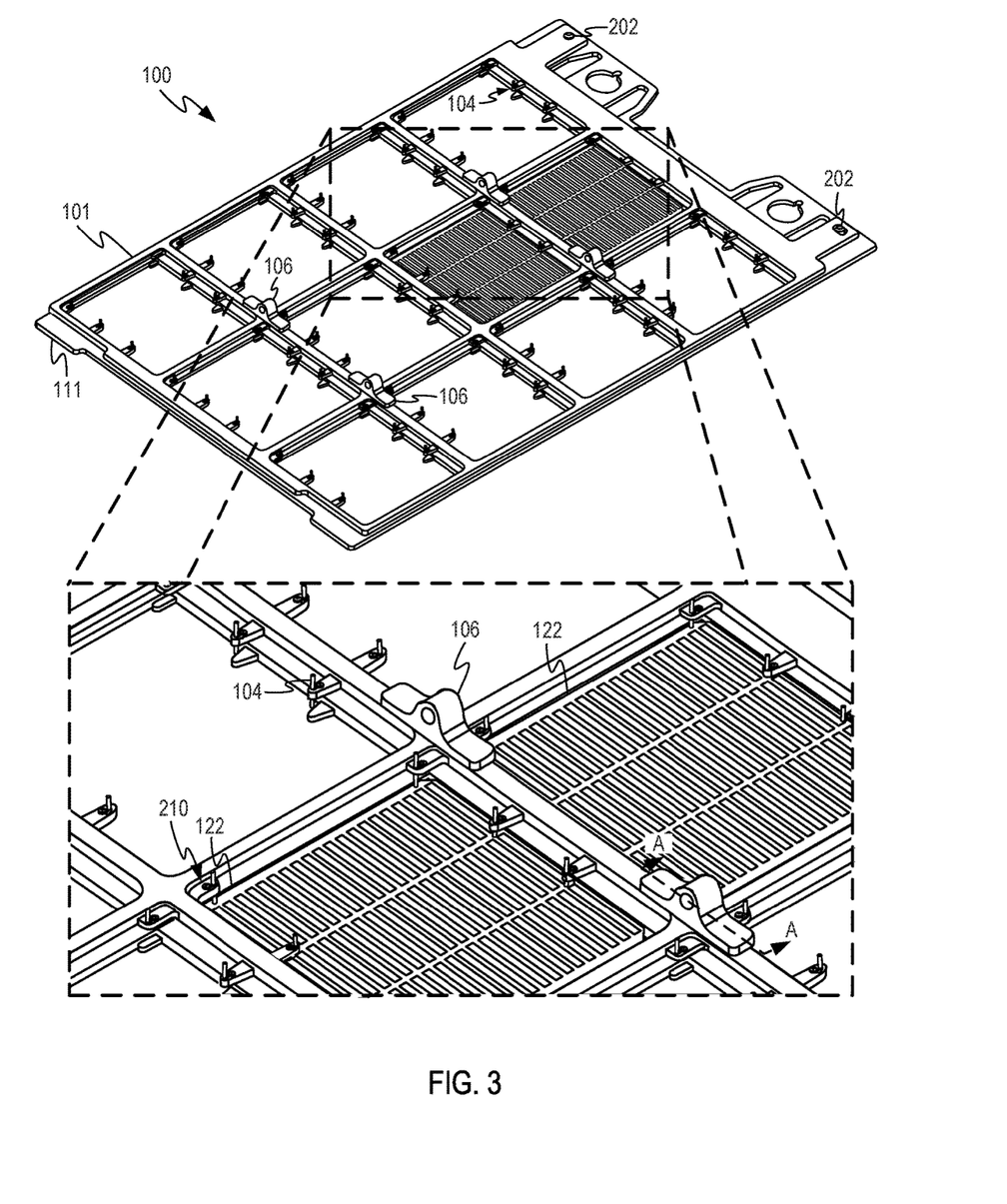
FIG. 3 shows the electroplating frame assembled from the upper and lower frames depicted in FIG. 2A carrying multiple solar cells.

FIG. 3 shows electroplating frame 100 assembled from upper and lower frames 101 and 111. Upper and lower frames 101 and 111 can be formed from a non-conductive material such as PEEK (polyether ether ketone) or coated conductive material such as stainless steel 430 covered by a layer of non-conductive material. Fasteners 202 are depicted joining lower frame 111 to upper frame 101. In embodiments where upper and lower frames 101 and 111 are formed of coated conductive material, fasteners 202 can be configured to electrically couple conductive portions of upper and lower frames 101 and 111 together. FIG. 2 also shows a close up view of a portion of electroplating frame 100 supporting solar cells 122.

Figure 4:
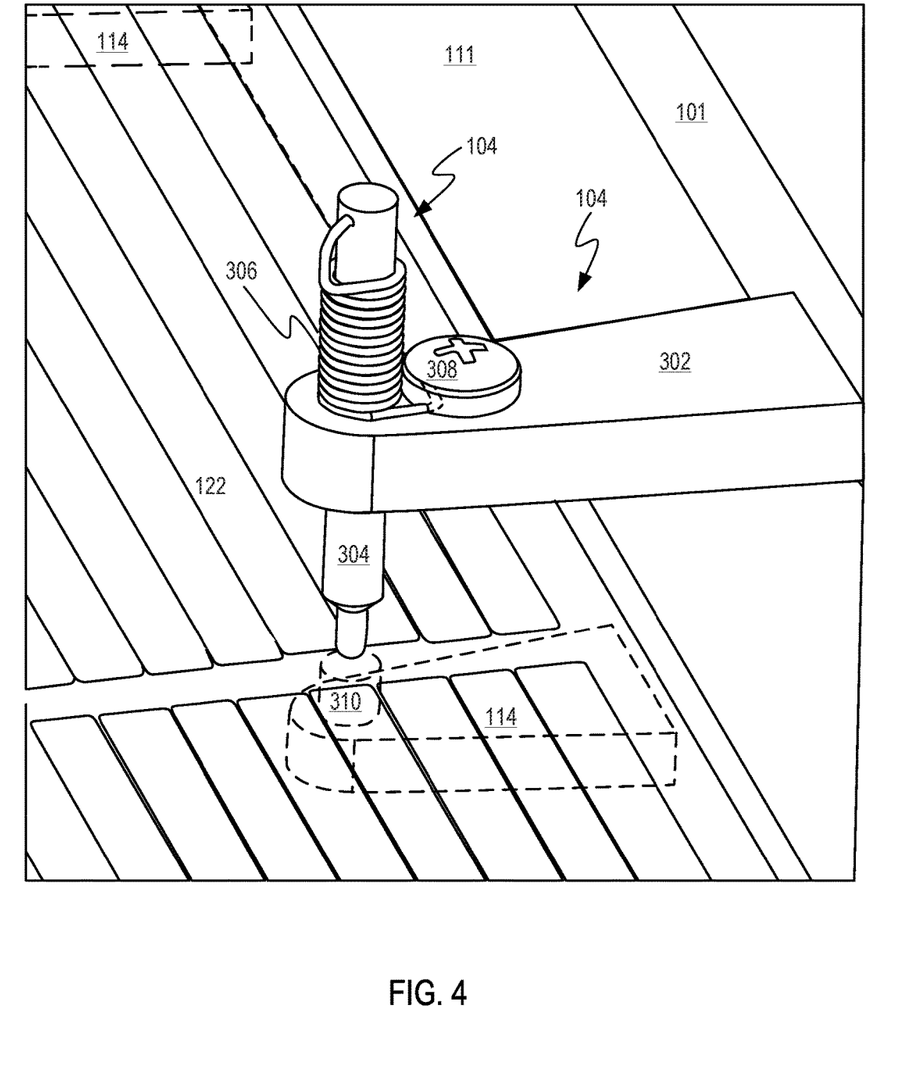
FIG. 4 shows a detailed close up view of a securing feature of the electroplating frame.

FIG. 4 shows a detailed close up view of one of electrical pins 104. Electroplating pin 104 is held by upper support structure 302 that protrudes from a lateral surface of upper frame 101 and supports spring loaded pin 204. Electroplating pin 104 extends through an opening defined by upper support structure 302, spring 306 coupled with electroplating pin 104 and non-conductive fastener 308. An internal portion of electroplating pin 104 that defines the opening can be electrically coupled with spring 306. Spring 306 can be an insulated spring with a conductive core configured to electrically couple pin 304 with upper support structure 302. One end of spring 306 can be engaged within an opening defined by spring 306, as depicted. The conductive core of spring 306 can contact a conductive internal portion of pin 304, thereby electrically coupling pin 304 with spring 306. The opposite end of spring 306 can be lodged beneath fastener 308.

Fastener 308 also functions to compress the end of spring 306 against a conductive portion of support structure 302. Securing spring 306 results in a mechanical and electrical coupling between electroplating pin 104 and upper support structure 302. In this way, when upper frame 101 is secured to lower frame 111 and pin 304 contacts a surface of solar cell 122, spring 306 is stretched and exerts a force upon solar cell 122 by way of electroplating pin 104. This force exerted by spring 306 through electroplating pin 104 on solar cell 122 may increase in certain situations to keep solar cell 122 from falling out of electroplating frame 100 when electroplating frame 100 is positioned in different orientations where gravity starts to bias solar cell 122 towards pin 304.

FIG. 4 also depicts lower support structure 114 which extends from a lateral surface of lower frame 111. Lower support structure 114 includes protrusion 310 positioned beneath pin 304 that is configured to support the portion of solar cell 122 that receives force exerted by spring 306 through pin 304. Protrusion 310 is depicted as having a cylindrical geometry but it should be noted that protrusion 310 can have any shape but generally will have a substantially planar distal end for supporting a flat surface of solar cell 122.

Solar cell 122 can be plated by first depositing a thin seed layer of copper upon solar cell 122 in a preceding step using a vapor deposition process. The thin seed layer of copper acts as a binder that allows the metallic plating to adhere to solar cell 122 during an electroplating operation. Subsequently, portions of the seed layer are masked, and the non-masked areas can be electroplated. The electroplating operation has the effect of substantial thickening the copper layer. The remaining seed layer under the mask can be subsequently removed to form finger lines and busbars.

Figure 5A:
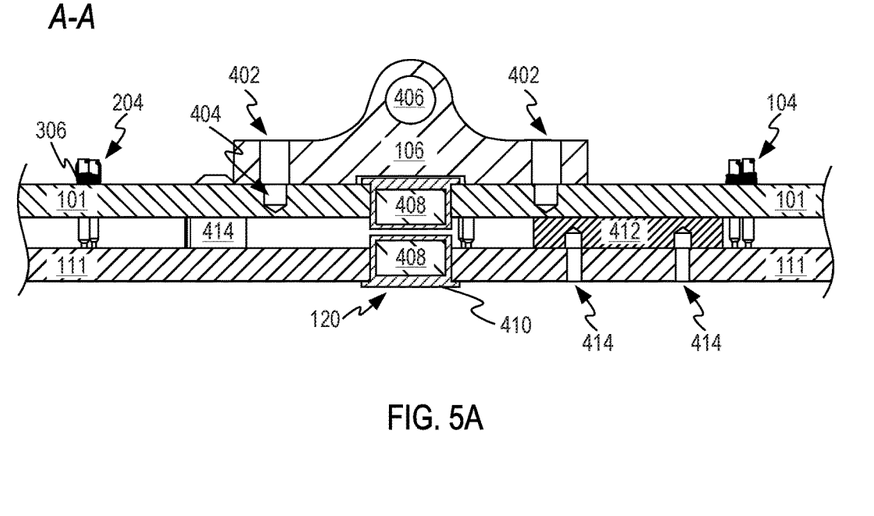
FIG. 5A shows a cross-sectional view of a portion of the electroplating frame in accordance with the section line A-A depicted in FIG. 2.

FIG. 5A shows a cross-sectional view of a portion of electroplating frame 100 in accordance with section line A-A depicted in FIG. 3. In particular, carrying handle 106 is depicted overlaying magnetic fasteners 120. Carrying handle 106 can be fastened to upper frame 101 by way of openings 402 defined by carrying handle 106 and openings 404 defined by upper frame 101. Carrying handle 106 defines opening 406, which can be used to facilitate picking up and putting down upper frame 101 by one or more robotic arms. In particular, a position of carrying handle 106 directly above magnetic fasteners 120 allows minimal amounts of bending stresses to be placed upon upper and lower frames 101 and 111 when separating upper and lower frames 101 and 111.

Magnetic fasteners 120 can take the form of permanent magnet 408 housed within magnet enclosure 410. Each of magnet enclosures 410 can include a lip that prevents passage of magnetic fastener 120 through either upper frame 101 or lower frame 111. Magnet enclosures 410 can also be formed from electrically insulating materials well suited for withstanding corrosion caused by the charged fluids present in electroplating fluids.

FIG. 5A also depicts a hard stop 412. Hard stop 412 can take the form of a low-profile solid block of material affixed to either upper frame 101 or lower frame 111. As depicted, hard stop 412 can be coupled with lower frame 111 by way of fastener extending through openings 414 defined by lower frame 111 to engage openings defined by hard stop 412. Hard stop 412 along with other hard stops 412 distributed throughout electroplating frame 100 cooperate to set a precise distance separating upper frame 101 from lower frame 111. By establishing a fixed interval between the frames, an amount of force exerted by electrical pins 104 can be regulated as a solar cell 122 positioned within pocket 112 of lower frame 111 will cause compression of spring 306 by a fixed distance yielding a predictable amount of force on solar cell 122. In this way, hard stop 412 prevents excess force from being applied by spring loaded pins 204 to solar cells 122.

Hard stop 412 also establishes a fixed gap between magnetic fasteners 120. In some embodiments, the gap between magnetic fasteners 120 can be about 3 mm, while upper and lower frames 101 and 111 can have a thickness of about 6 mm each. By preventing direct contact between magnetic fasteners 120, magnetic fields emitted by permanent magnets 408 can be configured to align with one another, thereby preventing friction between magnetic fasteners 120 from preventing lateral movement of upper frame 101 with respect to lower frame 111. Furthermore, the fixed distance between magnets 408 sets a predefined force with which magnetic fasteners 120 attract one another. For this reason when automation machinery is used to separate the upper and lower frames a the automation machinery can be configured to apply a predefined amount of force known to be able to overcome the magnetic coupling joining upper frame 101 to lower frame 111.

Figure 5B:
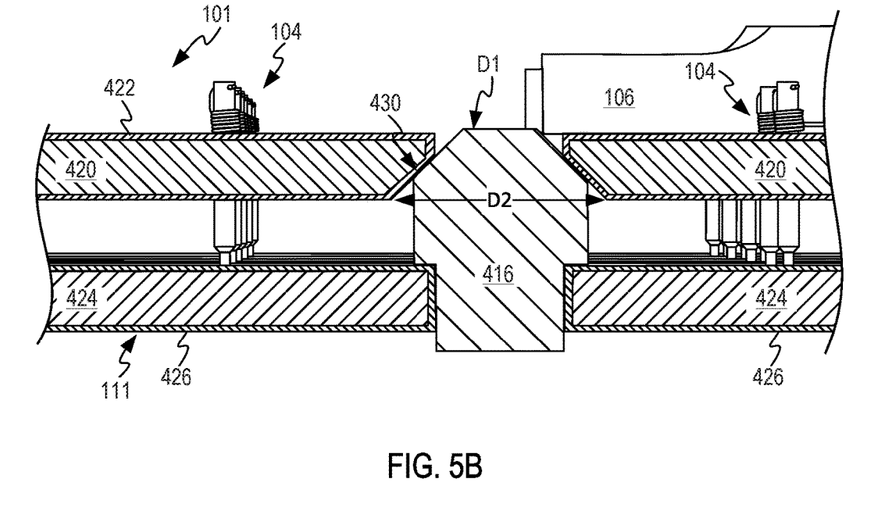
FIG. 5B shows another cross-sectional view showing an alignment feature of the electroplating frame.

FIG. 5B shows another cross-sectional view of electroplating frame 100. In particular, alignment feature 416 is depicted. A sloped head of alignment feature 416 interacts with a tapered opening 430 defined by upper frame 101 to further refine the alignment of upper frame 101 with respect to lower frame 111. The sloped head has a linear slope; however, in some embodiments, the sloped head can have a convex or concave curvature configured to interact with a complementary opening defined by upper frame 101. The tapered configuration allows for easy and automated alignment between upper frame 101 and lower frame 111, and allows for non-precise alignment between the frames. Small diameter D1 of alignment feature 416 only has to be brought within an alignment zone defined by large diameter D2 of tapered opening 430. As shown, this allows for a wide alignment tolerance due to the self-aligning nature of the alignment feature 416. For example, if the diameter D1 is 3 mm, and D2 is 9 mm, alignment feature 416 can be misaligned off center by as much as 3 mm and still self-align with tapered opening 430.

As magnetic fasteners 120 pull upper and lower frames 101 and 111 together, interaction between the sloped head and tapered walls automatically aligns the frames together. In this way, alignment features 416 and magnetic fasteners 120 cooperate to achieve exacting alignment tolerances when upper and lower frames 101 and 111 are brought into close but non-precise alignment with one another. While only a single alignment feature 416 is depicted it should be noted that alignment features 414 can be distributed throughout electroplating frame 100 to assist in facilitating precise alignment of upper and lower frames 101 and 111. And further, while lower frame 111 is shown to hold alignment feature 416, upper frame 101 can also hold alignment features 416 and lower frame 111 can include openings for cooperating with alignment features 416.

FIG. 5B also shows an alternative internal structure of upper frame 101. In particular, upper frame 101 is depicted as having electrically conductive core 420 and electrically insulating protective layer 422. Electrically insulating protective layer 422 can be configured to prevent buildup of plating material on upper frame 101 and can also prevent the electrically charged plating fluids from dissolving portions of upper frame 101 during a plating operation.

An alternative internal structure of lower frame 111 is also depicted in FIG. 5B. In particular lower frame 111 includes an electrically conductive core 424 and an electrically insulating protective layer 426. Electrically insulating protective layer 426 can prevent direct contact between electrically conductive core 424 and the electrically charged plating fluids, yielding similar benefits as the configuration described in conjunction with upper frame 101. In some embodiments, electrically conductive cores 420 and 424 can be formed of stainless steel (e.g. SUS 430). The electrically insulating protective layers 422 and 426 can be formed from any number of electrically insulating materials. In some embodiments, the electrically insulating material can take the form of a dielectric glaze that covers exposed portions of electrically conductive cores 420 and 424. In some embodiments, the thickness of electrically insulating protective layers 422 and 426 can be between 50 and 100 microns.

Figure 6A:
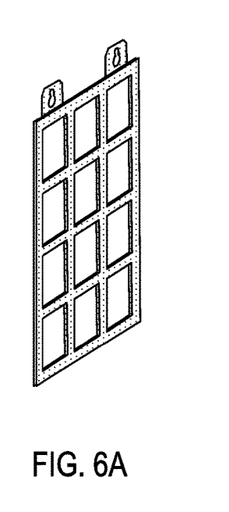
FIGS. 6A-6G show a series of actions taken to load solar cells into a electroplating frame and electroplate the solar cells in accordance with the described embodiments.

FIGS. 6A-6G show a series of actions taken to load an electroplating frame similar to the electroplating frames described above. FIG. 6A shows the electroplating frame without any solar cells disposed within it, and arranged in a vertical orientation with a lower frame and upper frame assembled together. The electroplating frame may be in this orientation for any number of reasons. For example the electroplating frame may be stored in this manner. In some embodiments the electroplating frame may be hung up to dry for a short period of time after having been used to conduct one or more electroplating operations.

Figure 6B:
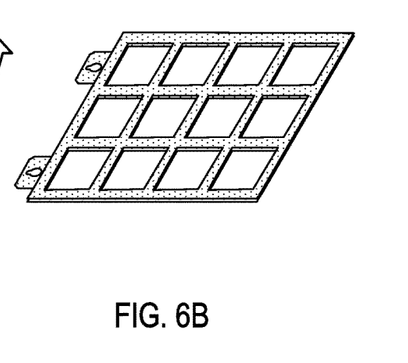

FIG. 6B shows the electroplating frame reoriented in a horizontal position. The reorientation can be carried out by a robotic arm that grips a portion of the electroplating frame and maneuvers it into the horizontal position. In some embodiments, the electroplating frame can be positioned within a holding fixture that is secured to the lower frame after the electroplating frame is placed in the horizontal orientation.

Figure 6C:
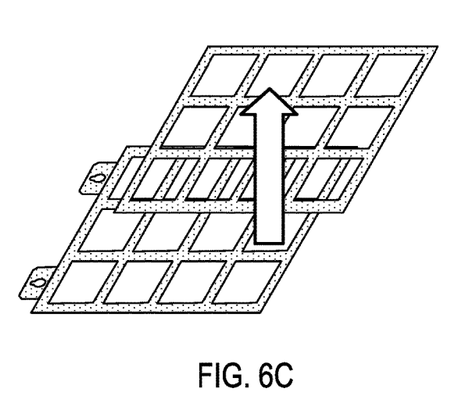

FIG. 6C shows an upper frame being separated from a lower frame to provide access to an interior of the electroplating frame. One or more robotic arms can be used to apply the force necessary to remove the upper frame from the lower frame. The force necessary to separate the frames is typically greater than the magnetic forces coupling the frames together. In some embodiments, fasteners electrically coupling the upper and lower frames together are removed prior to overcoming the magnetic coupling. In embodiments where the lower frame is secured in place by the holding fixture a robotic arm need only be configured to pull on the upper frame on account of the lower frame being secured in place by the holding fixture.

Figure 6D:
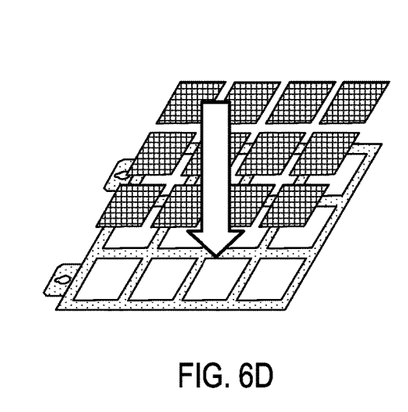

FIG. 6D shows multiple solar cells being loaded into the lower frame. The solar cells can be loaded into the lower frame in many ways including but not limited to an automated robotic arm such as a pick and place with a vacuum head configured to precisely pick up and place each of the solar cells within a corresponding one of the pockets defined by the lower frame. Although all the solar cells are shown being placed concurrently, it should be understood that the solar cells can also be placed sequentially by one or more pick and place apparatus.

Figure 6E:
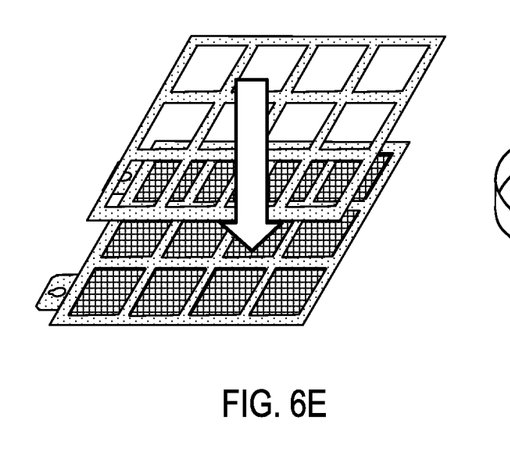

FIG. 6E shows the upper frame being magnetically coupled to the lower frame. The robotic arm can include a vision system configured to achieve a rough alignment of the upper and lower frames; however, once an approximate alignment has been achieved and the frames approach one another the magnetic fasteners within the magnetic frames can help to achieve a precise coupling of the upper and lower frames.

Figure 6F:
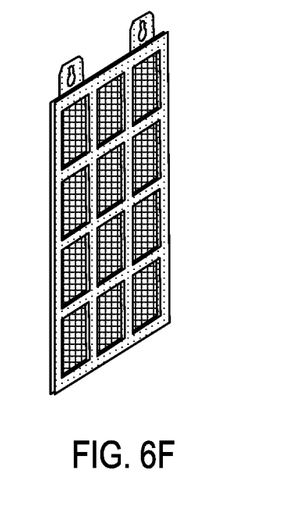

FIG. 6F shows the electroplating frame being reoriented into a vertical position. The magnets and spring loaded pins distributed throughout the electroplating frame prevent the solar cells from shifting or falling out during the reorientation of the electroplating frame. The reorientation of the electroplating frame can be carried out in a similar manner as was described with respect to FIG. 6B.

Figure 6G:
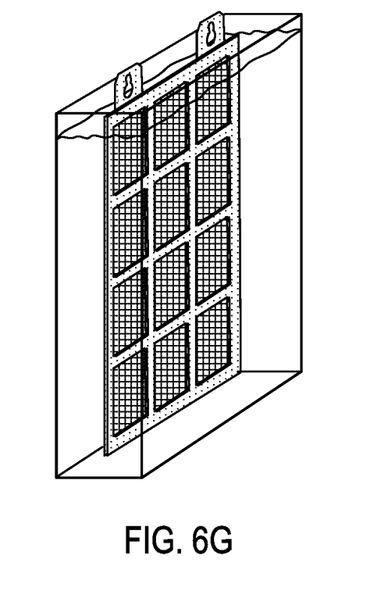

FIG. 6G shows how the electroplating frame can be immersed in a plating tank for electroplating the submerged solar cells. In some embodiments, a robotic/automated arm or arms can be configured to shake or maneuver the electroplating frame inside the plating tank to increase the speed at which the electroplating process occurs. The aforementioned robotic arms can be driven by a processor driven automated manufacturing process or manufacturing line that can be varied or adapted for various products and product types.

Figure 7A:
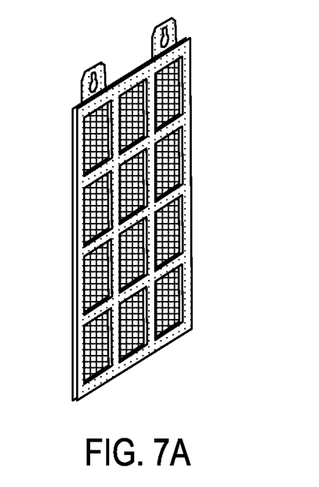
FIGS. 7A-7F show a series of actions taken to remove solar cells from a electroplating frame subsequent to an electroplating operation.

FIGS. 7A-7F show a series of actions taken to remove solar cells from a electroplating frame subsequent to an electroplating operation. FIG. 7A shows the electroplating frame in a vertical orientation after having been removed from an electroplating tank in which each of the solar cells within the electroplating frame underwent a plating operation.

Figure 7B:
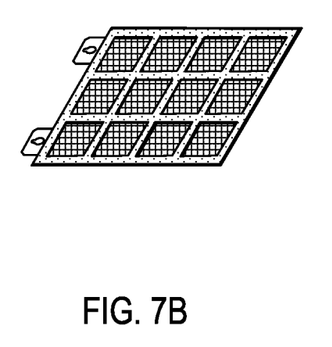
Figure 7C:
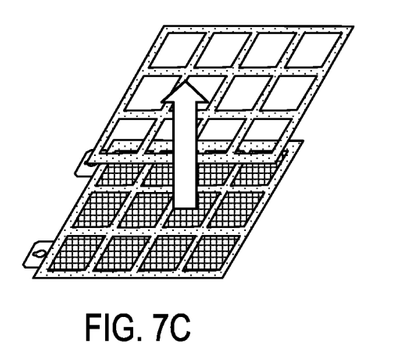

FIG. 7B shows the electroplating frame being reoriented into a horizontal orientation. Reorientation of the electroplating frame can be performed by a robotic arm or by a number of individuals. FIG. 7C shows the upper frame being lifted away from the lower frame. This removal of the upper frame from the lower frame can be carried out by robotic arms exerting a pulling force on carrying handles distributed along an exterior facing surface of the upper frame. The carrying handles can be positioned directly above magnetic fasteners distributed within the upper frame and the lower frame. In this way, by pulling on each of the carrying handles the same amount little or no bending forces can be experience by the upper frame as the magnetic coupling between the upper and lower frame magnetic fasteners is overcome. Because the lower frame is in a horizontal orientation, the solar cells positioned within pockets of the lower frame can remain securely in place.

Figure 7D:
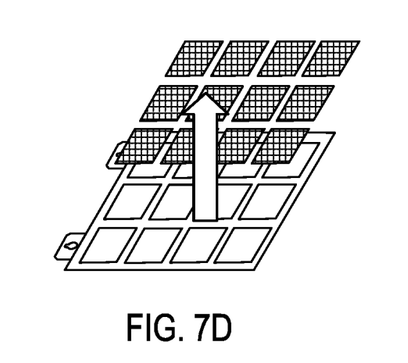

FIG. 7D shows solar cells being lifted out of the lower frame for further processing or packaging. While all of the solar cells are shown being lifted out of the lower frame simultaneously it should be understood that the solar cells can also be removed sequentially. For example, a pick and place could be configured to pull out each solar cell and move it to the next step in the manufacturing process.

Figure 7E:
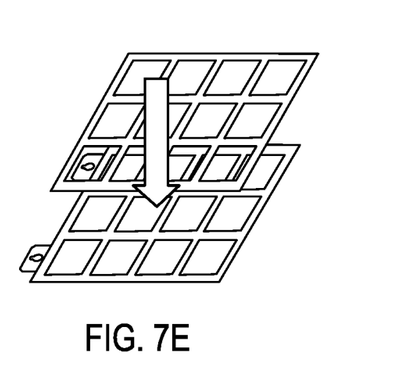

FIG. 7E shows upper frame being magnetically coupled to the lower frame. A robotic arm could carry out this operation by placing the upper frame close enough to the lower frame for the magnetic fasteners within the frame to begin attracting each other with substantial amounts of force. At this point the robotic arm can release the upper frame and the two frames become magnetically coupled together.

Figure 7F:
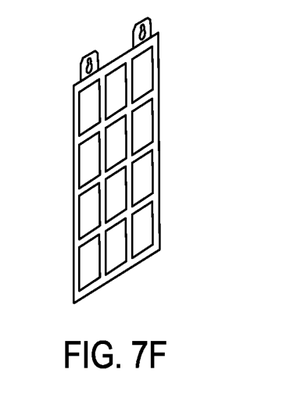

FIG. 7F shows the electroplating frame being reoriented into a vertical orientation for storage of later use. In some embodiments, the robotic arm that joined the frames together can be used to carry out the orientation change by grabbing onto a protruding portion of the lower frame and reorienting the electroplating frame.

The various aspects, embodiments, implementations or features of the described embodiments can be used separately or in any combination. Various aspects of the described embodiments associated with use of the manufacturing tools can be implemented by software, hardware or a combination of hardware and software. The described automated processes can help to control manufacturing operations or help in controlling a manufacturing line.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electroplating frame for supporting a plurality of solar cells during a manufacturing operation, the electroplating frame comprising:
    a first frame defining a plurality of pockets, each of the pockets having a shape and size suitable for supporting one of the plurality of solar cells;
    a second frame;
    a first plurality of magnetic fasteners distributed within the first frame;
    a second plurality of magnetic fasteners distributed within the second frame, each magnetic fastener of the first and second plurality of magnetic fasteners comprising a magnet and a casing, magnetic forces between the first and second plurality of magnetic fasteners being configured to secure the first and second frames together by applying the magnetic forces to the first and second frames through the casings of the first and second plurality of magnetic fasteners to compress the first and second frames between the first and second plurality of magnetic fasteners.

2. The electroplating frame of claim 1, further comprising:
a plurality of hard stops configured to establish a minimum interval between the first and second frames when the frames are secured together.

3. The electroplating frame of claim 2, wherein the plurality of hard stops prevent the first plurality of magnetic fasteners within the first frame from directly contacting the second plurality of magnetic fasteners within the second frame.

4. The electroplating frame of claim 1, wherein the first plurality of magnetic fasteners within the first frame are arranged in the same pattern as the second plurality of magnetic fasteners in the second frame.

5. The electroplating frame of claim 1, wherein the first frame comprises a plurality of support structures distributed about a periphery of each of the pockets that are configured to support the solar cells within the pockets.

6. The electroplating frame of claim 1, wherein the second frame comprises a plurality of carrying handles disposed proximate each of the magnets distributed within the second frame.

7. The electroplating frame of claim 6, wherein the plurality of carrying handles each include an opening configured to receive a portion of a robotic arm for manipulating the second frame.

8. The electroplating frame of claim 1, wherein the first and second frames comprise electrically conductive cores surrounded by a protective layer of electrically insulating material.

9. An electroplating frame suitable for supporting a plurality of solar cells during a manufacturing operation, comprising:
a first frame comprising a first plurality of magnetic fasteners extending through a first plurality of openings defined by the first frame, the first plurality of openings being arranged in a first pattern; and
a second frame comprising a second plurality of magnetic fasteners extending through a second plurality of openings defined by the second frame, the second plurality of openings being arranged in a second pattern complementary to the first pattern, a magnetic force between the first and second plurality of magnetic fasteners being configured to secure the first and second frames together by compressing the first and second frames between the first and second plurality of magnetic fasteners,
wherein the first and second frames cooperate to define a plurality of locations within the electroplating frame when compressed together by the first and second plurality of magnetic fasteners, each of the locations having a size and shape suitable for accommodating a solar cell of the plurality of solar cells.

10. The electroplating frame of claim 9, further comprising:
a plurality of alignment features coupled with the second frame and having sloped ends that engage tapered openings defined by lateral walls of the first frame when the first and second frames are being magnetically coupled together, the interaction between the plurality of alignment features and the lateral walls of the first frame refining an alignment between the first and second frames.

11. The electroplating frame of claim 10, wherein the first frame further comprises a plurality of electroplating pins distributed around a periphery of the plurality of locations, the plurality of electroplating pins configured to compress portions of each of the plurality of solar cells against the second frame to prevent movement of the plurality of solar cells during reorientation of the electroplating frame.

12. The electroplating frame of claim 11, wherein the plurality of electroplating pins define conductive pathways configured to deliver electrical energy to the plurality of solar cells during an electroplating operation.

13. The electroplating frame of claim 11, wherein the electroplating pins comprise spring loaded pins positioned within a corresponding aperture by a support structure extending from a lateral wall of the first frame.

14. The electroplating frame of claim 9, wherein each magnetic fastener of the first and second plurality of magnetic fasteners comprises a permanent magnet disposed within a magnet enclosure.

* * * * *